United States Patent [19]

Hirayama

[11] Patent Number: 5,107,144
[45] Date of Patent: Apr. 21, 1992

[54] INTEGRATED CIRCUIT HAVING FIELD EFFECT TRANSISTORS

[75] Inventor: Hiromitsu Hirayama, Tokyo, Japan
[73] Assignee: NEC Corporation, Tokyo, Japan
[21] Appl. No.: 487,721
[22] Filed: Mar. 2, 1990

[30] Foreign Application Priority Data

Mar. 3, 1989 [JP] Japan ............................... 1-52329
Mar. 3, 1989 [JP] Japan ............................... 1-52332

[51] Int. Cl.$^5$ .................. H03K 19/003; H03K 19/094
[52] U.S. Cl. .................................... 307/448; 307/443; 307/475; 307/491; 307/565
[58] Field of Search ............... 307/443, 448, 475, 264, 307/561, 565, 568, 550, 362, 491

[56] References Cited

U.S. PATENT DOCUMENTS

| | | | |
|---|---|---|---|
| 4,410,815 | 10/1983 | Ransom et al. | 307/475 |
| 4,450,369 | 5/1984 | Schuermeyer | 307/475 |
| 4,929,852 | 5/1990 | Bae | 307/475 |
| 4,945,258 | 7/1990 | Picard et al. | 307/443 |

Primary Examiner—John Zazworsky
Attorney, Agent, or Firm—Helgott & Karas

[57] ABSTRACT

An integrated circuit includes a logical part and a buffer part. A voltage clamping circuit is provided in parallel with a driver transistor of the logical part of the integrated circuit. The high level of the internal logical circuit is linked to the voltage of a first source power supply that is supplied to the driver transistor. A plurality of diodes may be used, connected in parallel as the voltage clamping circuit. A voltage clamping circuit may be formed alternatively by using a plurality of field transistors, each of the transistors using the gate as an anode and the short-circuited source and drain as a cathode, and the anode and the cathode are connected in series. An input buffer circuit of differential type configuration is used, and by inputting the voltage of a first source power supply to a reference voltage part of the input buffer circuit, the level conversion of an input voltage is made to be linked to variations of the voltage of the source power supply.

13 Claims, 5 Drawing Sheets

INTEGRATED CIRCUIT HAVING FIELD EFFECT TRANSISTORS

BACKGROUND OF THE INVENTION

1. Field of the Invention

The present invention relates to an integrated circuit, and more particularly to a logic integrated circuit constructed by using Schottky junction type field effect transistors that employ GaAs.

2. Description of the Prior Art

In an integrated circuit having a plurality of GaAs field effect transistors (referred to as FETs hereinafter), there appears a nonuniformity in the values of the threshold voltage which is caused by the differences in individual fabrication processes. In other words, the threshold voltage varies from one FET to another. For this reason, all the FETs used in the prior art integrated circuits are of the depletion-mode FETs.

There are cases in which logic circuits are constructed using integrated circuits having the depletion-mode FETs. Such a logic circuit has a buffered FET logic (referred to as BFL circuit hereinafter) for output.

A logic circuit of this kind is connected to a power supply for the drain which supplies the ground potential (0 V), a first power supply for the source which supplies a voltage ($-2.0$ V, for example) lower than the drain power supply, and a second power supply for the source which supplies a voltage that is still lower than the first source power supply.

Now, such a logic circuit is sometimes cascade-connected to a different type of integrated circuit made of a different semiconductor material in order to construct a larger logic circuit. In a case of this kind, the logic levels of the output signals of the respective integrated circuits have to be matched with high accuracy. Since the logic level is directly related to the voltage of the first source power supply, the allowable specification of variations in the voltage of the first source power supply has to be managed particularly rigorously. However, the power unit itself becomes costly in order to restrain the variations of the supply voltage to a strict specification value.

BRIEF SUMMARY OF THE INVENTION

Object of the Invention

Therefore, it is an object of the present invention to provide an integrated circuit which is capable of stabilizing logic output levels even for variations in the voltage of the first source power supply.

Summary of the Invention

In the integrated circuit according to the present invention, a voltage clamping circuit is provided in parallel to a driving transistor in the logic part of the BFL circuit, and the high level of the internal logic circuit is linked to the voltage of the first source power supply which is supplied to the driving transistor.

It is preferable to use a plurality of diodes that are connected in parallel as a voltage clamping circuit. Or, a voltage clamping circuit formed by a plurality of FETs, each of which uses the gate as the anode and short-circuited source and drain as the cathode, may be made use of.

Moreover, in another mode of the present invention, an arrangement may be made in which an input buffer circuit of differential configuration is used, and the voltage of the first source power supply is input to the reference voltage part of the buffer circuit to link the level conversion quantity of the input voltage to the variations of the voltage of the source power supply.

In accordance with the present invention, the level matching for the gate and the source supply voltages in the driving transistor of the logic circuit in the next stage can be made stable. Accordingly, the range of the tolerance level in the voltage of the first source power supply can be improved. In other words, this permits a relaxation of the tolerance range for the specification of the logic levels for the logic input voltage. In particular, the nondefective rate of the operational performance for super-high frequency above 3 GHz can be improved markedly.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
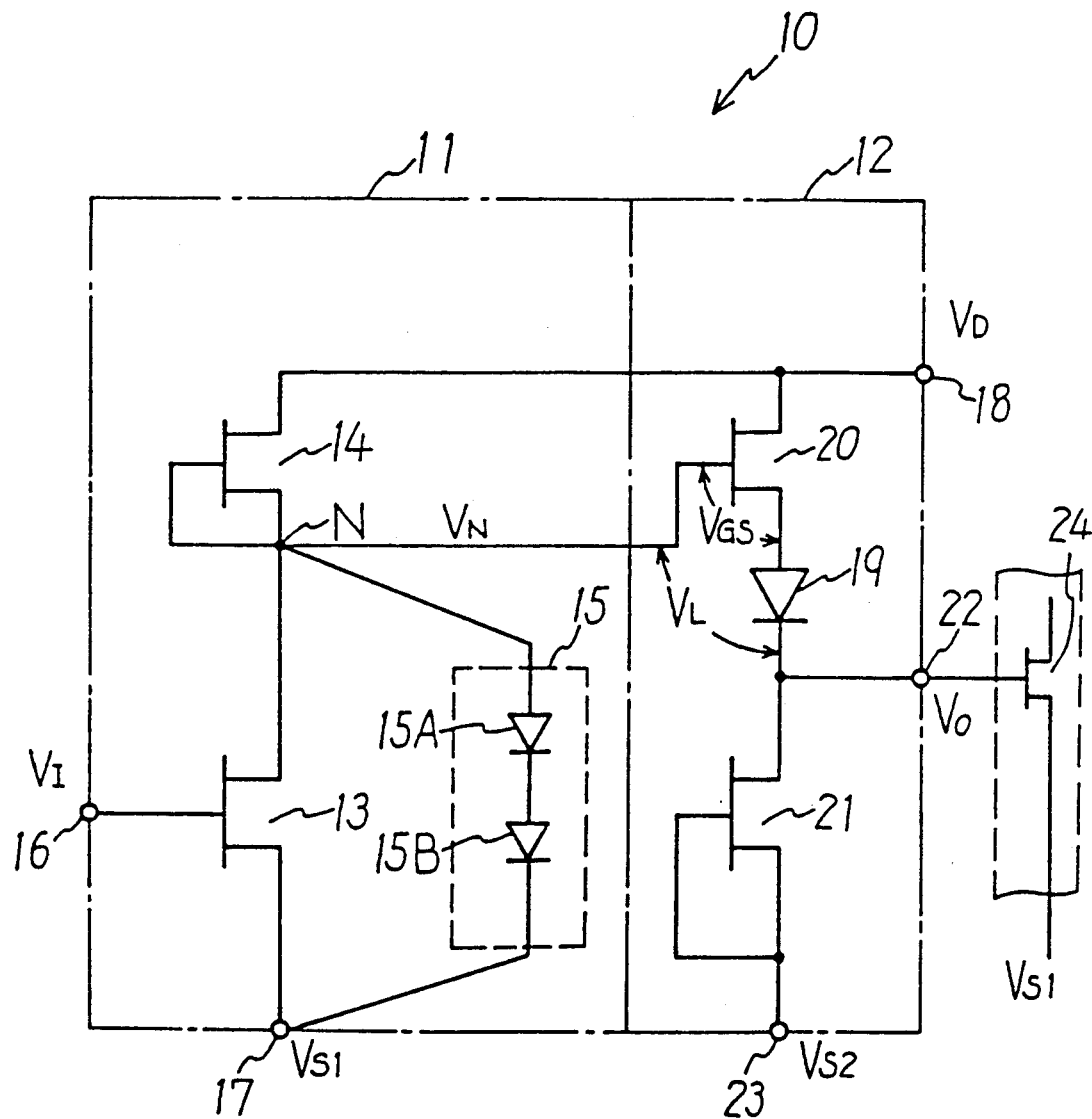
FIG. 1 is a circuit diagram for the BFL circuit in accordance with a first embodiment of the present invention.

Referring to FIG. 1, a BFL circuit 10 for the GaAs integrated circuit according to the first embodiment of the present invention includes a logic part 11 and a buffer part 12. The logic part 11 is an inverter circuit which includes serially connected FETs 13 and 14, and a clamping circuit 15 connected between the drain and the source of the FET 13. The gate and the source of the FET 13 are connected to an input terminal 16 and the terminal 17 of a first source power supply, respectively. The drain of the FET 13 is connected to the source and the gate of the FET 14. The drain of the FET 14 is connected to the terminal 18 of a drain power supply. The clamping circuit 15 has two serially connected Schottky diodes as clamping diodes 15A and 15B.

The buffer part 12 includes a level shifting diode 19, and FET's 20 and 21 that are serially connected via the diode 19. The gate and the drain of the FET 20 are connected to the drain of the FET 13 and the terminal 18 of the drain power supply, respectively. The source of the FET 20 is connected to the drain of the FET 21 and an output terminal 22 via the diode 19. The source and the gate of the FET 21 are connected to the terminal 23 of a second source power supply.

An input voltage $V_I$ is supplied to the input terminal 16, and an output voltage $V_O$ is output from the output terminal 22. The source voltages $V_{S1}$, $V_D$ and $V_{S2}$ supplied to the power terminals 17, 18 and 23 are set at $-2.0$ V, 0V and $-5.2$ V, respectively.

The logic input voltage $V_I$ takes on a high level and a low level centered around the voltage $V_{S1}$ ($-2.0$ V) of the first source power supply. Since the input voltage $V_I$ is inverted by the FET 13, at a node N of the drain of the FET 13 and the source of the FET 14 there is obtained a node voltage $V_N$ whose level changes in the direction opposite to that of the input voltage $V_I$.

First of all, the operation of a BFL circuit in the case when the clamping circuit is absent will be described. The node voltage $V_N$ goes to a voltage ($-2.0$ V) which is substantially equal to the voltage $V_{S1}$ of the first power supply when the input voltage $V_I$ is at the high level, and to a voltage (0 V) which is substantially equal to the voltage $V_D$ of the drain power supply when the input voltage $V_I$ is at the low level.

The output voltage $V_O$ takes on a value ($V_O = V_N - V_L$) which is smaller than the node voltage $V_N$ by a level converted quantity $V_L$ due to the FET 20. When the input voltage $V_I$ is at the high level, the FET 20 is in the saturated state, and the level connected quantity becomes equal to the forward voltage $V_F$ of the diode 19, so that the output voltage $V_{O1}$ for this case is as given by Eq. (1) below.

$$V_{O1} = V_{S1} - V_F = -2.0 - 0.7 = -2.7 (V) \quad (1)$$

When the input voltage $V_I$ is at the low level, the FET 20 is in the unsaturated state, and the level converted quantity is further augmented by the voltage $V_{GS}$ (about 0.6 V) between the gate and the source, so that the output voltage $V_{O2}$ for that case is as given by Eq. (2) below.

$$V_{O2} = V_D - (V_{GS} + V_F) = -1.3 (V) \quad (2)$$

Consequently, the output voltage $V_O$ takes on a high level and a low level that are higher and lower, respectively, by 0.7 V than the voltage $V_{S1}$ of the first source power supply. This output voltage $V_O$ is supplied to the gate of a FET 24 of the logic circuit in the next stage. In this manner, the voltage $V_{GS}$ between the gate and the source of the FET 24 takes on the values that are higher and lower by 0.7 V with respect to the voltage $V_{S1}$ of the first source power supply, so that it can be supplied to the FET 24 as an input voltage with high matching of the dc levels.

As is clear from Eq. (1), the output voltage $V_{O1}$ directly depends on the voltage $V_{S1}$ of the first source power supply, so that it becomes necessary to constrain the variations in the voltage $V_{S1}$ of the first source power supply to small values in order to obtain a stable logical operation. For instance, when the voltage $V_{S1}$ of the first source power supply is varied from the specified value ($-2.0$ V) to $-1.5$ V with a raise of 0.5 V, the output voltage $V_{O1}$ becomes $-2.2$ V from $-2.7$ V with a rise of 0.5 V. As a result, the voltage $V_{GS}$ between the gate and the source of the FET 24 in the next stage logic circuit is dropped from 0.7 V to 0.2 V, thereby making the FET 24 susceptible to malfunctions due to noise.

Conversely, when the voltage $V_{S1}$ of the first source power supply is varied to $-2.5$ V with a drop of 0.5 V from the specification value, the output voltage $V_{O1}$ becomes $-3.2$ V with a drop of 0.5 V from $-2.7$ V. Consequently, the voltage $V_{GS}$ between the gate and the source of the FET 24 in the next stage integrated circuit is raised to 1.2 V. Because of this, the fanout of the buffer part 12 is lowered due to a current that flows through the Schottky junction of the FET 24. Moreover, since the FETs 14 and 20 are in the unsaturated state in this case, the output voltage $V_{O2}$ is dropped due to a parasitic resistance between the drain and the gate.

In the BFL circuit 10 according to the first embodiment of the present invention a clamping circuit 15 is provided, so that aforementioned problems can satisfactorily be resolved.

Next, the operation of the first embodiment will be described. If the forward voltage between the anode and the cathode of the clamping diodes 15A and 15B in the active state is called $V_F$, the node voltage $V_{NC}$ when the input voltage is at the low level (high level voltage of the node voltage) can be represented in terms of a clamping voltage $V_C$ by Eq. (3).

$$V_{NC} = V_{S1} + V_C = V_{S1} + 2V_F \quad (3)$$

It is to be noted in the above that the threshold voltages of all of the GaAs integrated circuit FETs are set at $-0.5$ V, and the voltage between the anode and the cathode of the diodes is set at $-0.7$ V. Accordingly, if the voltage $V_{NC}$ of the node is smaller than $-0.5$ V, the FET's 14 and 20 will always be acting in their saturated regions. The output voltage $V_{O3}$ in this case (high level output voltage when the input voltage $V_I$ is at the low level) can be represented by Eq. (4).

$$V_{O3} = V_{NC} - V_F = V_{S1} + V_F \quad (4)$$

As in the above, in the first embodiment, output voltages of $V_{O1}$ ($= V_{S1} - V_F$) shown in Eq. (1) and $V_{O3}$ ($= V_{S1} + V_F$) shown in Eq. (4) are supplied to the FET 24 in the next stage logic circuit when the input voltage $V_I$ is at the high and low levels, respectively. That is, the output voltage invariably takes on the logical levels $V_{S1} \pm V_F$. In this way, the voltage $V_{GS}$ between the gate and the source of the FET 24 of the next stage integrated circuit invariably takes on the fixed values $\pm V_F$ irrespective of the value of the voltage $V_{S1}$ of the first source power supply.

Next, analogous to the case in which the voltage $V_{S1}$ of the first source power supply is varied from the specification value $-2.0$ V to $-2.5$ V will be considered. When the input voltage $V_I$ is at the high level, an output voltage given by Eq. (1) is obtained analogous to the case when the clamping circuit is absent. When the input voltage $V_I$ is at the low level, the clamping voltage $V_{NC}$ at the node N is found to be $-1.1$ V from Eq. (3). The output voltage $V_{O3}$ becomes $-1.8$ V from Eq. (4) which is higher by 0.7 V than the voltage ($-2.5$ V) of the first source power supply. Hence, the voltage $V_{GS}$ between the gate and the source of the FET 24 of the next stage integrated circuit is always equal to 0.7 V, so that there will be generated neither malfunctions due to noise nor deterioration in the fanout.

As in the above, even when there occurs variations in the voltage $V_{S1}$ of the first source power supply, the output voltage invariably takes on the logic levels $V_{S1} \pm V_F$, so that it becomes possible to markedly enlarge the range of allowable variations of the voltage $V_{S1}$ of the first source power supply.

Moreover, since all the FET's in the first embodiment operate in their saturated regions, there arises no drop in the margin for the bias voltage setting of the circuit due to variations in the output voltage caused by the nonuniformity of the fabrication process of the unsaturated regions. Moreover, that the FETs operate in their saturated regions means that there will be no generation of the switching noise which would otherwise occur in the unsaturated regions.

Figure 2:
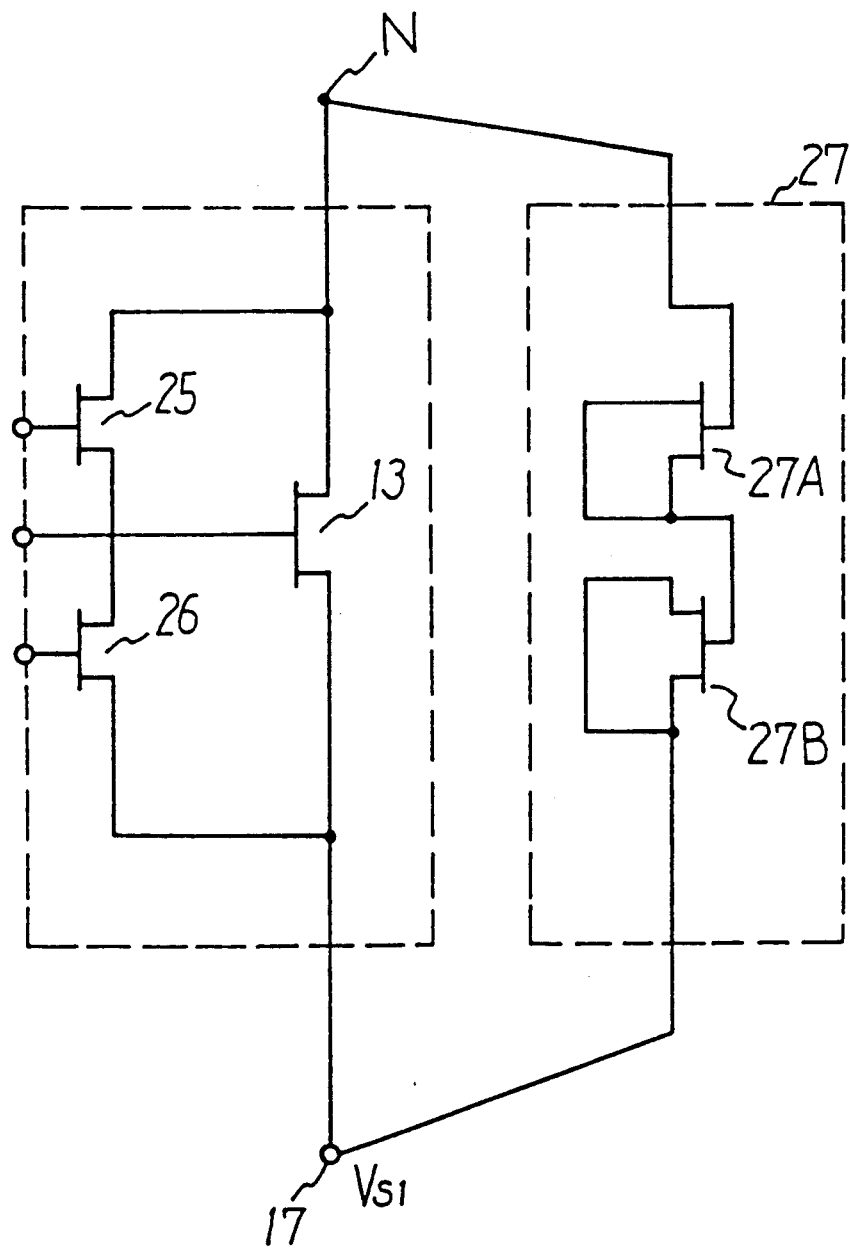
FIG. 2 is a partial circuit diagram of the logic part for the BFL circuit in accordance with a second embodiment of the present invention.

Referring to FIG. 2, the logical part of the BFL circuit according to a second embodiment of the present invention is a NAND-NOR circuit, and a NAND circuit formed by FET's 25 and 26 being connected in parallel to the FET 13 in the logic part 11 of the BFL circuit 10 of the first embodiment.

Further, in place of the clamping circuit 15 in the first embodiment there is provided a clamping circuit 27 which is formed by the serial connection of FETs 27A and 27B that are diode-connected (namely, connection in which the gate is served as an anode, and the short-circuited source and drain is served as a cathode). In the clamping circuit 27, a clamping voltage is generated by utilizing the characteristics of Schottky junction in the diode-connected FETs 27A and 27B. Since the input capacitances of the FETs 27A and 27B are small in comparison to those of the clamping diodes 15A and 15B, the switching rate of the logic circuit can be improved. Further, the forward voltage between the anode and the cathode of the Schottky junction in the FET is substantially equal to the forward voltage between the anode and the cathode of the Schottky diode so that the dc level operation in the second embodiment is substantially the same as in the case of the first embodiment.

Moreover, in the second embodiment, the thresholds of the FETs 13, 25 and 26 are set, differing from those of the other FETs 14, 20 and 21, at shallower values of about $-0.1$ to $-0.3$ V. By so setting, it becomes possible to enlarge the range of allowable variations of the logical voltage supplied to the FETs 13, 25 and 26, compared with that in the prior art devices.

As described in the above, the following can be said concerning the first and the second embodiments, Namely:

(1) Since no use is made of the characteristics for the unsaturated region of the FET, the voltage drop in the circuit can be made uniform, and the design for the logic level matching can be facilitated.

(2) It is possible to enlarge the range of tolerances for the voltage of the first source power supply.

(3) Since an excessive output high level voltage can be excluded, there will not flow a forward gate current in the FET of the logic circuit in the next stage. Because of this, no deterioration of the reliability and the fanout characteristics would be caused with the BFL circuit.

Figure 3:
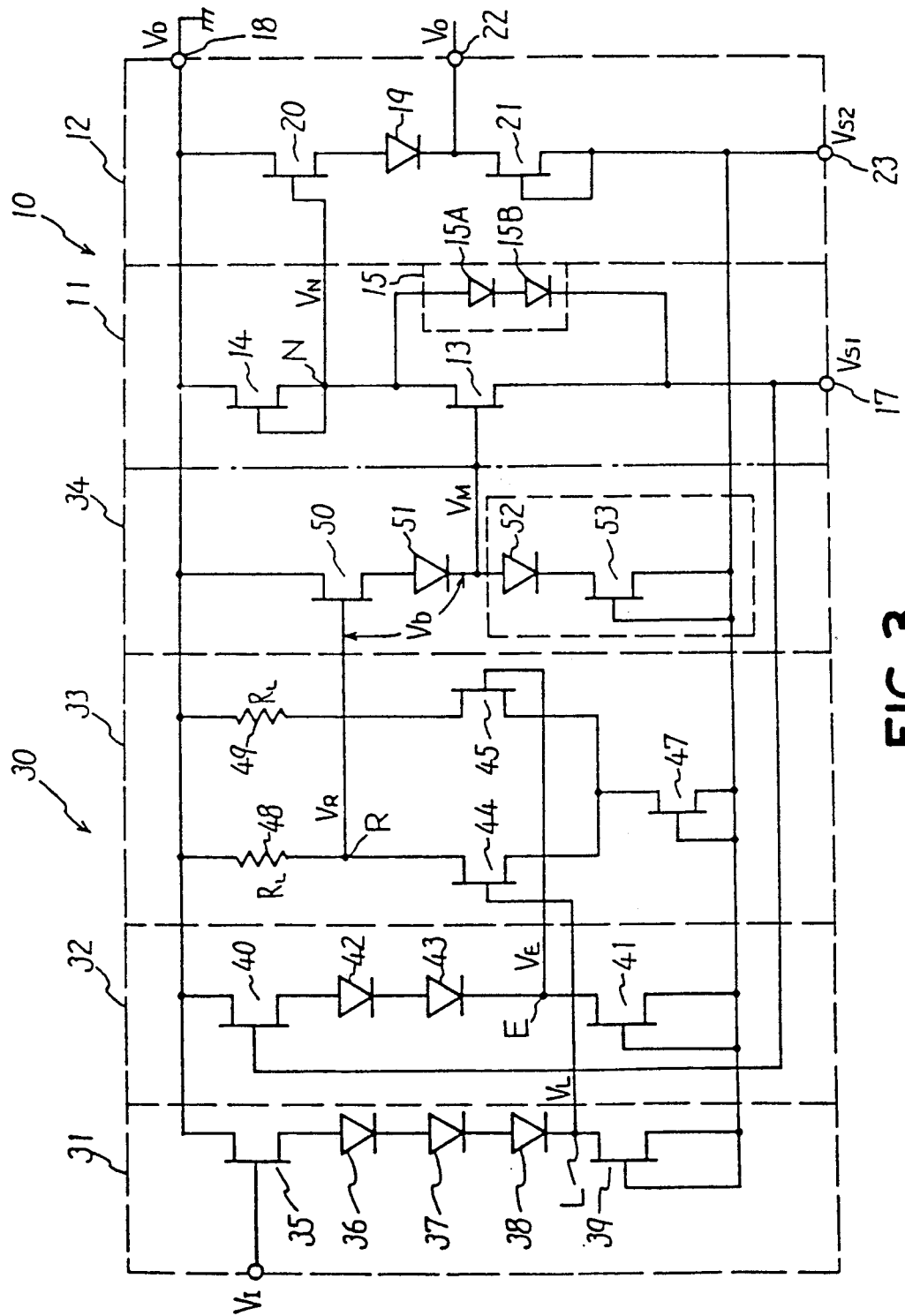
FIG. 3 is a circuit diagram for the integrated circuit in accordance with a third embodiment of the present invention.

Referring to FIG. 3, the integrated circuit according to a third embodiment of the present invention has an input buffer circuit 30 and a BFL circuit 10. The BFL circuit 10 is the same as the first embodiment shown in FIG. 1 so that its explanation will be omitted.

The input buffer circuit 30 includes an input level conversion part 31 which converts the input voltage $V_I$ to a level converted voltage $V_L$, a reference voltage part 32 which generates a fixed reference voltage $V_E$, a differential inverter part 33 which outputs a differential amplifier voltage $V_R$ between the reference voltage $V_E$ and the level converted voltage $V_L$, and a buffer part 34 which outputs a matching voltage $V_M$ that is level shifted to the voltage $V_{S1}$ of the first source power supply by receiving the differential amplifier voltage $V_R$.

The input level conversion part 31 includes a FET 35 whose gate is supplied with an input voltage $V_I$ of $-1.35 \pm 0.4$ V which is an emitter coupled logic (ECL) level, level shift diodes 36, 37 and 38 that are connected serially to the source of the FET 35, and a FET 39 connected between the cathode of the diode 38 and the terminal 23 of the second source power supply. The forward voltage drop of the level shift diodes 36, 37 and 38 are all equal to $V_F$. The drain of the FET 35 is connected to the terminal 18 of the drain power supply.

The reference voltage part 32 includes FETs 40 and 41 that are serially connected between the terminal 18 of the drain power supply and the terminal 23 of the second source power supply, and serially connected diodes 42 and 43 that are connected between the source of the FET 40 and the drain of the FET 41.

The differential inverter part 33 includes FETs 44 and 45 which are supplied with the level conversion voltage $V_L$ and the reference voltage $V_E$, respectively, a FET 47 which is commonly connected between the sources of the FETs 44, 45 and the terminal 23 of the second source power supply, and resistors 48 and 49 which are commonly connected between the drains of the FETs 44, 45 and the terminal 18 of the drain power supply. In the differential inverter part 33, when the level conversion voltage $V_L$ and the reference voltage $V_E$ are equal, the current that flows in the FET 47 is divided into parts that flow in 48 and 49, where the center of the load voltage is designed to be at $-1.5$ V. The amplification characteristic of the differential inverter part 33 is one that performs an analog amplification of gain unity for the input voltage difference of $(V_L - V_E)$.

The buffer part 34 includes a FET 50 to which is supplied the differential amplifier voltage $V_R$, level shift diodes 51 and 52 which are connected to the source of the FET 50, and a FET 53 which is connected between the cathode of the diode 52 and the terminal 23 of the second source power supply. The drain of the FET 50 is connected to the terminal 18 of the drain power supply. The gate width of the FET 50 is designed to be twice as large so that of other FET's, the voltage between its gate and the source is set at $-1.15$ V with opposite bias, and the level conversion voltage is set at 0.5 V which is smaller than the ordinary value of 0.65 V.

Supposing that a voltage fixed to the intermediate level ($-1.35$ V) of the input logical level is applied to the gate of the FET 40, the voltage levels $V_L$, $V_E$, $V_R$ and $V_M$ at the nodes E, L, R and M are represented by Eqs. (5), (6), (7) and (8) below.

$$V_L = V_I - 3V_F = -1.35 - 1.95 = -3.3(V), \quad (5)$$

$$V_E = V_L = -3.3(V), \quad (6)$$

$$V_R = V_D - \{(R_L I/2) + (V_L - V_E) \times 1\} = -1.5(V), \quad (7)$$

$$V_M = V_R - V_B = -1.5 - 0.5 = -2.0(V), \quad (8)$$

where $V_D = 0$ V, $V_{S1} = -2.0$ V, $V_{S2} = -5.2$ V, $V_I = -1.35$ V, $V_B = -0.5$ V and $V_F = 0.65$ V.

Accordingly, the voltage $V_M$ and the voltage $V_{S1}$ of the first source power supply have the mutually equal value of $-2.0$ V.

If the logic levels of the input voltage $V_I$ are represented as $(V_I \pm \Delta V_i)$, the voltage $V_{GS}$ between the gate and the source of the FET 13 of the BFL circuit 10 becomes equal to the inverted voltage $\Delta V_i$ of an ac component with no dc bias voltage. In general, $\Delta V_i$ is in the range of 0.4 to 1.0 V.

In the above case, the reference voltage is fixed so that when the voltage $V_{S1}$ of the first source power supply is varied toward the higher voltage side, the bias voltage $V_{GS}$ between the gate and the source of the FET 13 of the BFL circuit 10 becomes shallow with respect to the high level of the voltage $V_M$ at the node M, so that the margin against noise is lowered. Conversely, when the voltage $V_{S1}$ of the first source power supply is varied toward the lower side, the bias voltage $V_{GS}$ between the gate and the source of the FET 13 of the BFL circuit 10 becomes deep with respect to the high logical level of the voltage $V_M$ at the node M, so that the leakage current between the gate and the source of the FET 13 is increased and the fanout of the output of the buffer part 12 is lowered. As the countermeasure for this, there is required a stabilized power supply with very narrow range, for example, $-(2.0 \pm 0.1)$ V, of a tolerance in the voltage $V_{S1}$ of the first source power supply.

In contrast, in the reference voltage part 32 of the third embodiment the gate of the FET 40 is connected to the terminal 17 of the source power supply, and the voltage $V_{S1}$ of the first source power supply is supplied. Accordingly, the reference voltage $V_E$ and the differential amplifier voltage $V_R$ are given by Eqs. (9) and (10), respectively.

$$V_E = V_{S1} - 2 V_F, \quad (9)$$

$$\begin{aligned} V_R &= V_D - \{(R_L \cdot I/2) + (V_L - V_E) \times 1\} \\ &= -1.5 - \{(-1.35 - 3 V_F) - (V_{S1} - 2 V_F)\} \\ &= -1.5 + (V_{S1} + 1.35 + V_F) = V_{S1} + 0.5 \, [V] \end{aligned} \quad (10)$$

The intermediate level voltage $V_M$ at the node M is given by Eq. (11).

$$V_M = V_M - 0.5 = V_{S1}. \quad (11)$$

In other words, the voltage $V_M$ of the node M is linked to the voltage $V_{S1}$ of the first source power supply. Accordingly, the voltage $V_{GS}$ between the gate and the source of the FET 13 of the BFL circuit 10 can automatically be set always at zero bias without being affected by the variations of the voltage $V_{S1}$ of the first source power supply.

Figure 4:
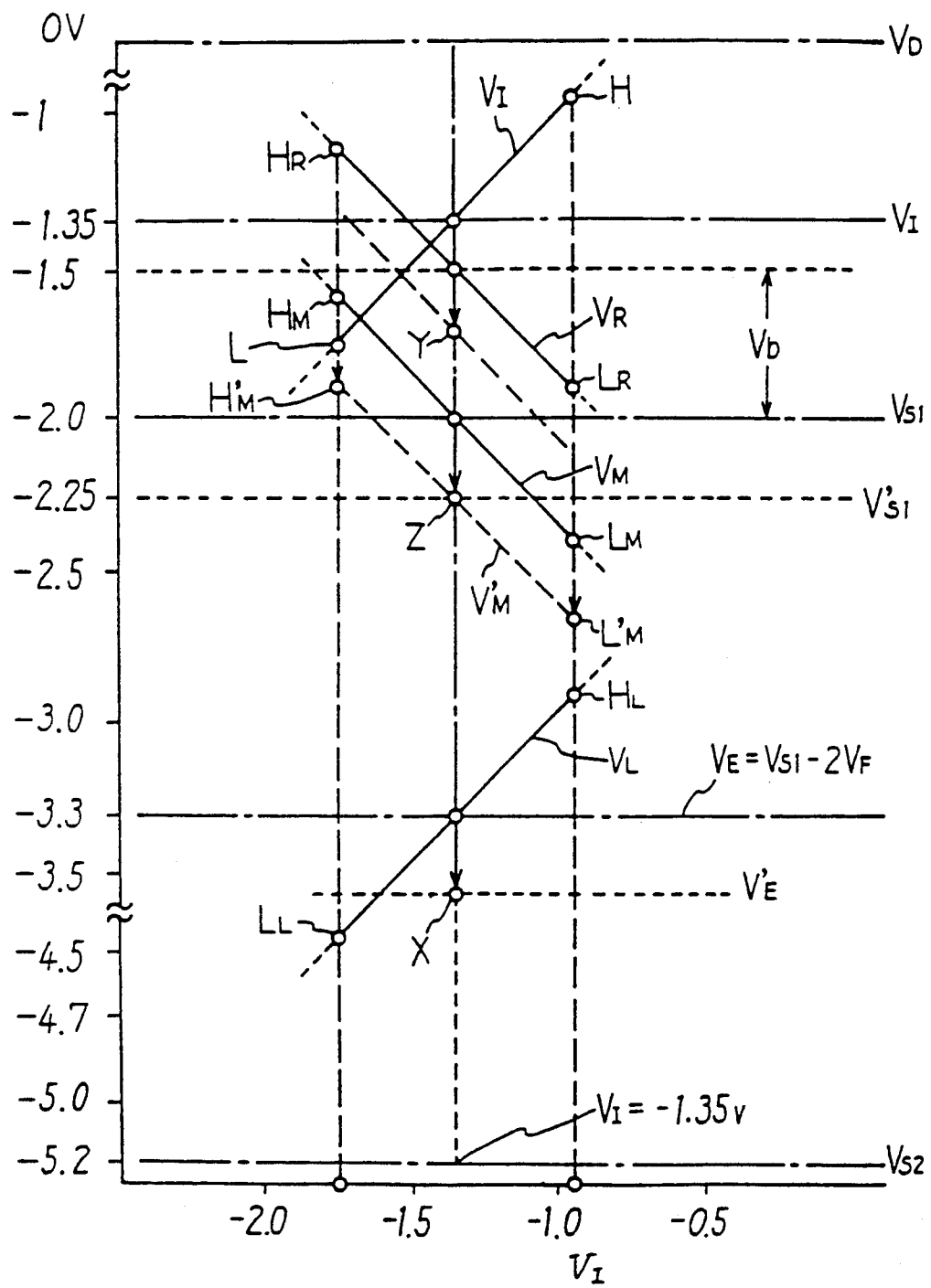
FIG. 4 is a diagram explaining the operation of the third embodiment of the present invention shown in FIG. 3.

Referring to FIG. 4, the operation of the third embodiment will be described next.

The input voltage $V_I$ takes on a high level and a low level of $+0.4$ V and $-0.4$ V, respectively, with respect to the intermediate level of $-1.35$ V. The level conversion voltage $V_L$ takes on a high level $H_L$ and a low level $L_L$ centered around $-3.3$ V. The reference voltage $V_E$ becomes $-3.3$ V when the voltage of the first source power supply is $-2.0$ V. The differential amplifier voltage $V_R$ takes on a low level $L_R$ and a high level $H_R$ centered around $-1.5$ V, with opposite phase. The level matching voltage $V_M$ takes on a low level $L_M$ and a high level $H_M$ centered around $-2.0$ V.

Now, suppose that the voltage $V_{S1}$ of the first source power supply of $-2.0$ V is lowered by about $\Delta V_{S1}$ (0.25 V) to become the voltage $V_{S1}'$ of the source power supply of $-2.25$ V as shown in the figure by a broken line. The reference voltage $V_E$ of $-3.3$ V goes to a reference voltage $V_E'$ of $-3.55$ V shown by a broken line by being moved to an operating point X which is lower by the value of 0.25 V same as the $\Delta V_{S1}$. Since the amplification gain of the differential inverter part 33 is unity, the intermediate levels of the differential amplifier voltage $V_R$ and the level matching voltage $V_M$ are moved to the operating points Y and Z that are lower by $\Delta V_{S1}$. Therefore, the intermediate level $V_M'$ of the new level matching voltage becomes $-2.25$ V which is equal to the level of $V_{S1}'$. This means that a voltage $V_{S1}'$ of the first source power supply is being applied to the source. In other words, the voltage $V_{GS}$ between the gate and the source of the FET 13 invariably inputs logical levels $H_M'$ and $L_M'$ centered around a zero bias voltage. Accordingly, there occurs no noise malfunctions and fanout deterioration due to the voltage $V_{S1}$ of the first source power supply, so that the range of allowable variations of the voltage of the first source power supply can be enlarged markedly.

It should be noted that in the circuit in FIG. 3 the logic input $V_M$ to the logical circuit 11 is compensated for the variations of the supply voltage so that it is possible to eliminate the clamping circuit 15 of the logical circuit.

Figure 5:
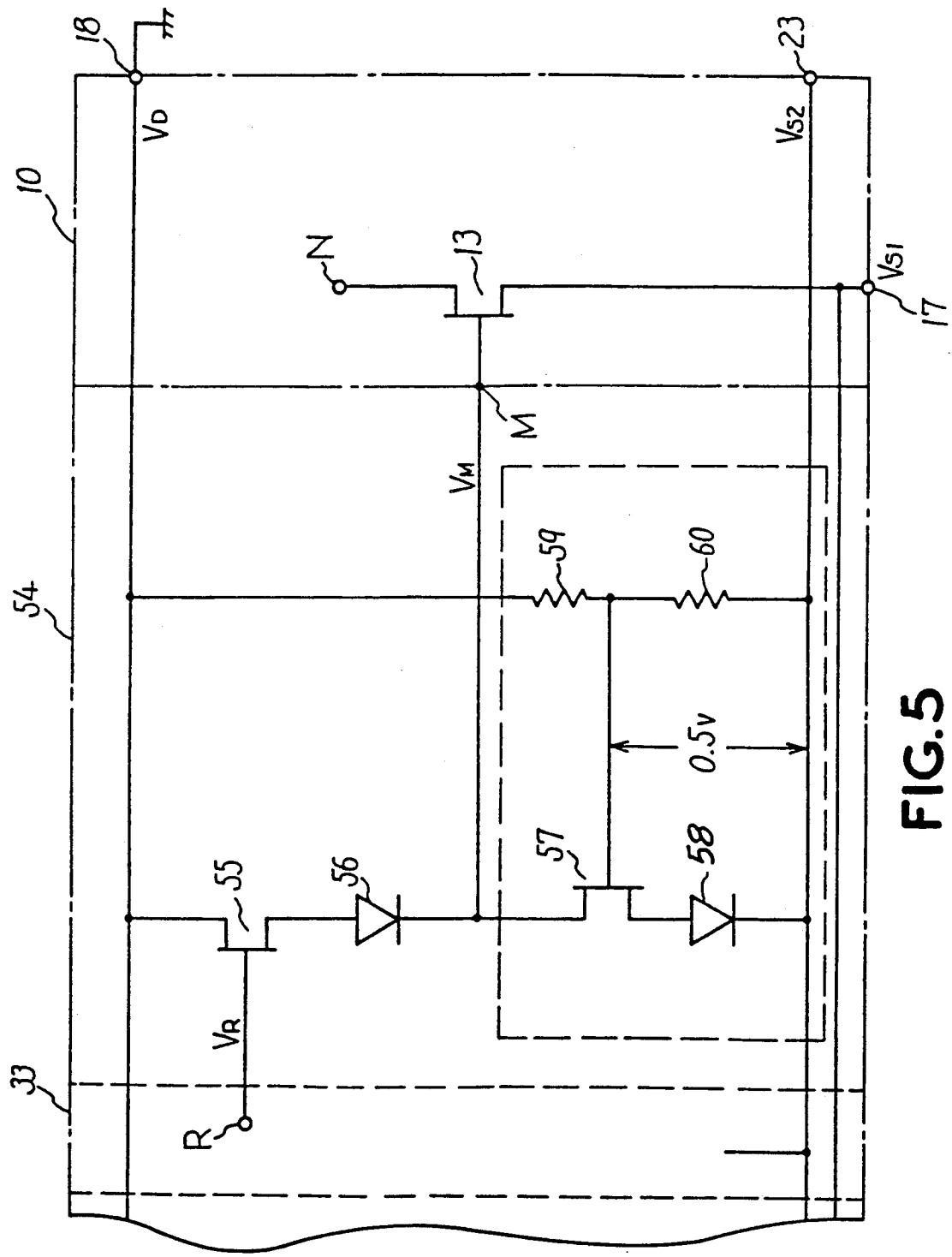
FIG. 5 is a partial circuit diagram for the integrated circuit in accordance with a fourth embodiment of the present invention.

Referring to FIG. 5, the integrated circuit of a fourth embodiment according to the present invention is the same as that of the third embodiment except for the buffer part of the input buffer circuit and the logical part of the BFL circuit. In the fourth embodiment, the logical part of the BFL circuit is a logic part that does not have a clamping circuit. A buffer part 54 includes a FET 55, a diode 56, a FET 57 connected to the cathode of the diode 56, a diode 58 disposed between the source of the FET 57 and the terminal 23 of the second source power supply, and the serially connected voltage dividing resistors 59 and 60 disposed between the terminal 18 of the drain power supply and the terminal 23 of the second source power supply. A voltage divided by the voltage dividing resistors 59 and 60 is supplied to the gate of the FET 57. The resistances of the voltage dividing resistors 59 and 60 are 4.7 k ohm and 0.5 k ohm, respectively, and the divided voltage supplied to the gate of the FET 57 is 0.5 V.

Since the FET 55 and the diode 56 are designed to be identical to the FET 57 and the diode 58, the characteristics of the respective sets are substantially identical so that the level conversion voltage has the same value, 0.5 V, as the divided voltage. In the third embodiment, use was made of the FET 50 which is different from the other FETs. In contrast, in the fourth embodiment, use may be made of the FET 50 that has the same design as the other FETs.

In addition, it is to be noted that the adjustment for the non-uniformity of the transistor properties and the value of the threshold voltage due to individual fabrication processes can be made easily since they depend solely on the ratio of resistances of the voltage dividing resistors 59 and 60. In the third and the fourth embodiments, the bias voltage between the gate and the source of the driving transistor in the next stage logic circuit is always stabilized to the close to zero by using the reference voltage and the clamping voltage, respectively, of the voltage of the first source power supply. Therefore, it is possible to obtain an integrated circuit having a large range of allowable variations in the voltage of the first source power supply.

In accordance with the present invention, the deterioration the operational characteristics caused by the mismatching of the logic level of the logic circuit due to variations of the voltage of the source power supply can be reduced. Therefore, the range of tolerance for the logic level of the input voltage of the GaAs integrated circuit for super-high frequency can be relaxed markedly, thereby enhancing the nondefective rate of the operational characteristics for the range of frequency, for example, of greater than 3 GHz.

Although the invention has been described with reference to specific embodiments, this description is not meant to be construed in a limiting sense. Various modifications of the disclosed embodiments will become apparent to persons skilled in the art upon reference the description of the invention. It is therefore contemplated that the appended claims will cover any modifications or embodiments that fall within the true scope of the invention.

What is claimed is:

1. An integrated circuit comprising:
   a first field effect transistor with an input signal supplied to the gate thereof, and with a voltage of a first source power supply supplied to the source thereof;
   a second field effect transistor with the source thereof connected to the drain of said first transistor, and with a voltage of a drain power supply supplied to the drain thereof;
   a clamping circuit connected between the source and the drain of said first transistor;
   a third field effect transistor with the gate thereof connected to the drain of said first transistor, and with the voltage of said drain power supply supplied to the drain thereof; and
   a fourth field effect transistor with the drain thereof connected to the source of said third transistor, and with a voltage of a second source power supply supplied to the source thereof.

2. An integrated circuit as claimed in claim 1, wherein the voltage of said first source power supply is lower than the voltage of said drain power supply, and higher than the voltage of said second source power supply.

3. An integrated circuit as claimed in claim 1, wherein said transistors are Schottky junction type field effect transistors.

4. An integrated circuit as claimed in claim 1, wherein each of said transistors is a field effect transistor having a Schottky junction type gate formed on a gallium arsenide substrate.

5. An integrated circuit as claimed in claim 1, wherein the drain voltage of said third transistor is lower than the threshold value of said transistor.

6. An integrated circuit as claimed in claim 1, wherein said transistors operate in their saturated regions.

7. An integrated circuit as claimed in claim 1, wherein said clamping circuit includes a plurality of serially connected diodes.

8. An integrated circuit as claimed in claim 1, wherein said clamping circuit includes a plurality of transistors, with each of the gates being used as an anode and the short-circuited source and drain being used as a cathode, and the anode and the cathode being serially connected.

9. In a semiconductor integrated circuit formed on a gallium arsenide substrate and constructed using Schottky junction type field effect transistors, the integrated circuit comprising:
   an internal logical circuit connected to a first power terminal, which includes a load field effect transistor having its gate and source connected to an internal output terminal, and a plurality of driver field effect transistors connected between said internal output terminal and a second power terminal; and
   a logic circuit which includes a source follower field effect transistor with its gate connected to said internal output terminal and its drain connected to said first power terminal, a logical level conversion circuit connected between the source terminal of said source follower field effect transistor and a third power terminal, and an output voltage clamping circuit connected between said internal output terminal and said second power terminal.

10. An integrated circuit as claimed in claim 9, wherein said clamping circuit comprises a plurality of diodes mutually connected in the forward direction that are connected between said internal output terminal and said second power terminal.

11. An integrated circuit as claimed in claim 9, wherein said clamping circuit comprises a plurality of field effect transistors mutually connected in series, with the gate of each field effect transistor used as an anode and with short-circuited drain and source used as a cathode, that are connected between an internal output terminal and said second power terminal.

12. An integrated circuit as claimed in claim 9, wherein said clamping circuit is formed by two diodes serially connected in forward direction between an internal output terminal and said second power terminal, and wherein a level converting diode is provided, whose anode is connected to the source electrode of said source follower field effect transistor and whose cathode is coupled to said third power terminal.

13. An integrated circuit comprising:
   a first logic level conversion circuit using an input terminal as an input thereof and being connected between a first power terminal and a second power terminal;
   a second logic level conversion circuit using a third power terminal as an input thereof and being connected between the first power terminal and the second power terminal;
   a differential inverter circuit which uses outputs of said first and second logic level conversion circuits as an input and a reference voltage input, respectively, and which is connected between the first and the second power terminals;
   a third logic level conversion circuit using an output of said differential inverter circuit as an input thereof and being connected between the first power terminal and the second power terminal;
   an internal logic circuit which includes a load field effect transistor having a gate and a source thereof connected to an internal output terminal and having a drain thereof connected to the first power terminal, and a driver field effect transistor with a gate thereof connected to an output terminal of said third logic level conversion circuit and a source-drain path thereof connected between said internal output terminal and said third power terminal; and
   a logic circuit which includes a source follower field effect transistor with a gate thereof connected to said internal output terminal and a drain thereof connected to said first power terminal, a logic level conversion circuit connected between a source terminal of said source follower field effect transistor and said second power terminal, and an output voltage clamping circuit connected between said internal output terminal and said third power terminal.

* * * * *